(12) United States Patent
Kobayashi et al.

(10) Patent No.: US 10,656,212 B2
(45) Date of Patent: May 19, 2020

(54) METHOD OF INSPECTING ELECTRIC POWER STORAGE DEVICE FOR SHORT CIRCUIT AND METHOD OF MANUFACTURING ELECTRIC POWER STORAGE DEVICE

(71) Applicant: TOYOTA JIDOSHA KABUSHIKI KAISHA, Toyota-shi, Aichi-ken (JP)

(72) Inventors: Kiwamu Kobayashi, Anjo (JP); Takeshi Goto, Kasugai (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 80 days.

(21) Appl. No.: 16/013,421

(22) Filed: Jun. 20, 2018

(65) Prior Publication Data

US 2019/0011502 A1    Jan. 10, 2019

(30) Foreign Application Priority Data

Jul. 10, 2017 (JP) .................................. 2017-134754

(51) Int. Cl.
| | |
|---|---|
| *G01R 31/36* | (2020.01) |
| *G01R 31/385* | (2019.01) |
| *H01M 10/48* | (2006.01) |
| *H01M 10/42* | (2006.01) |
| *G01R 31/392* | (2019.01) |

(Continued)

(52) U.S. Cl.
CPC ..... *G01R 31/3865* (2019.01); *G01R 31/3641* (2013.01); *G01R 31/392* (2019.01); *H01M 10/4285* (2013.01); *H01M 10/482* (2013.01); *H01M 10/486* (2013.01); *H01M 10/0525* (2013.01); *H01M 10/0587* (2013.01)

(58) Field of Classification Search
CPC ...... G01R 31/00; G01R 31/02; G01R 31/024; G01R 31/025; G01R 31/36; G01R 31/382; G01R 31/385; G01R 31/3865; G01R 31/389; G01R 31/392; G01R 19/00; G01R 19/165; G01R 19/16566; G01R 19/16571;

(Continued)

(56) References Cited

U.S. PATENT DOCUMENTS 8,334,699 B2 * 12/2012 Asakura ............... G01R 31/025
320/132
2010/0004885 A1    1/2010 Nakanishi
(Continued)

FOREIGN PATENT DOCUMENTS

| JP | 2008-288192 A | 11/2008 |
| JP | 2010-153275 A | 7/2010 |

(Continued)

*Primary Examiner* — Hoai-An D. Nguyen
(74) *Attorney, Agent, or Firm* — Sughrue Mion, PLLC

(57) ABSTRACT

A method of inspecting an electric power storage device for a short circuit includes voltage measuring of measuring a pre-detection device voltage of the electric power storage device that is pre-charged, current detecting of detecting a temporal change in a current flowing to the electric power storage device from an external electric power supply or a stable current value of the current by continuously applying an output voltage equal to the pre-detection device voltage to the electric power storage device from the external electric power supply, and determining of determining an internal short circuit in the electric power storage device based on the detected temporal change in the current or the stable current value of the current.

8 Claims, 11 Drawing Sheets

(51) Int. Cl.
*H01M 10/0525* (2010.01)
*H01M 10/0587* (2010.01)

(58) Field of Classification Search
CPC .... H01M 10/00; H01M 10/05; H01M 10/052;
H01M 10/0525; H01M 10/0587; H01M
10/42; H01M 10/4285; H01M 10/44;
H01M 10/443; H01M 10/48; H01M
10/482; H01M 10/486
USPC .................................................. 324/425, 426
See application file for complete search history.

(56) References Cited

U.S. PATENT DOCUMENTS

| | | | |
|---|---|---|---|
| 2010/0188054 A1* | 7/2010 | Asakura | G01R 31/025 320/161 |
| 2010/0201321 A1* | 8/2010 | Asakura | G01R 31/025 320/132 |
| 2013/0335009 A1 | 12/2013 | Katsumata et al. | |
| 2015/0255833 A1* | 9/2015 | Fujimaki | H01M 2/1686 429/49 |
| 2016/0169977 A1* | 6/2016 | Fukuhara | G01R 31/3648 324/434 |
| 2016/0259011 A1 | 9/2016 | Joe | |
| 2016/0377670 A1* | 12/2016 | Tamida | G01R 27/025 324/551 |

FOREIGN PATENT DOCUMENTS

| | | |
|---|---|---|
| JP | 2011-69775 A | 4/2011 |
| JP | 2014-222603 A | 11/2014 |
| KR | 10-2013-0142884 A | 12/2013 |
| KR | 10-2015-0043214 A | 4/2015 |
| RU | 2326473 C1 | 6/2008 |

\* cited by examiner

METHOD OF INSPECTING ELECTRIC POWER STORAGE DEVICE FOR SHORT CIRCUIT AND METHOD OF MANUFACTURING ELECTRIC POWER STORAGE DEVICE

INCORPORATION BY REFERENCE

The disclosure of Japanese Patent Application No. 2017-134754 filed on Jul. 10, 2017 including the specification, drawings and abstract is incorporated herein by reference in its entirety.

BACKGROUND

1. Technical Field

The present disclosure relates to a method of inspecting an electric power storage device for a short circuit by inspecting the electric power storage device for an internal short circuit, and a method of manufacturing an electric power storage device including the method of inspection for a short circuit.

2. Description of Related Art

In manufacturing of an electric power storage device such as a lithium ion secondary battery, a metallic foreign object of iron, copper, or the like may be mixed in with an electrode body or the like, and an internal short circuit (hereinafter, simply referred to as a short circuit) may be caused in the electric power storage device due to the mixed metallic foreign object. Thus, the electric power storage device may be inspected for the internal short circuit in the course of manufacturing the electric power storage device.

For example, the following method of inspection for the internal short circuit is known. That is, the assembled electric power storage device is charged for the first time, and then, the electric power storage device is subjected to aging by placing the electric power storage device under a high temperature condition of higher than or equal to 45° C. and lower than or equal to 70° C. Then, the electric power storage device is placed for self-discharge (discharged in a state where all electrode terminals are open), and a voltage decrease amount $\Delta Va$ caused by self-discharge is acquired from device voltages measured before and after the self-discharge. When the voltage decrease amount $\Delta Va$ is greater than a reference decrease amount $\Delta Vb$ ($\Delta Va > \Delta Vb$), a determination is made that a short circuit is present in the electric power storage device. Japanese Unexamined Patent Application Publication No. 2010-153275 (JP 2010-153275 A) is an example of a related technology (refer to the claims and the like in JP 2010-153275 A).

SUMMARY

In the method of detecting the presence of the internal short circuit based on the magnitude of the voltage decrease amount $\Delta Va$, in order to appropriately distinguish between an electric power storage device (normal product) not having an internal short circuit and an electric power storage device (defective product) having an internal short circuit considering a measurement resolution (for example, 10 μV) of a voltmeter, a time period in which the difference between the voltage decrease amount $\Delta Va$ of a normal product and the voltage decrease amount $\Delta Va$ of a defective product is sufficiently increased with respect to the measurement resolution of voltage measurement, for example, greater than or equal to 20 times the measurement resolution (greater than or equal to 200 μV) is needed. In addition, for example, when the capacity of the electric power storage device is high, or when an allowed short circuit current is low, a long period, for example, a few days or longer, may be needed for measuring the voltage decrease amount $\Delta Va$ (self-discharge), and the method of detecting a short circuit in the electric power storage device using the voltage decrease amount $\Delta Va$ has limits such that the amount of time for inspection for the internal short circuit and the amount of time for manufacturing the electric power storage device are relatively increased, thereby leading to a demand for a new method of inspection.

The present disclosure provides a method of inspecting an electric power storage device for a short circuit that enables inspection of an electric power storage device for an internal short circuit using a new method, and a method of manufacturing an electric power storage device including the method of inspection for a short circuit.

A first aspect of the present disclosure relates to a method of inspecting an electric power storage device for a short circuit by inspecting the electric power storage device for an internal short circuit. The method of inspecting the electric power storage device for a short circuit includes voltage measuring of measuring a pre-detection device voltage of the electric power storage device that is pre-charged, current detecting of detecting a temporal change in a current flowing to the electric power storage device from an external electric power supply or a stable current value of the current by continuously applying an output voltage equal to the pre-detection device voltage to the electric power storage device from the external electric power supply, and determining of determining the internal short circuit in the electric power storage device based on the detected temporal change in the current or the stable current value of the current.

In the method of inspecting the electric power storage device for a short circuit, the voltage measuring, the current detecting, and the determining are performed, and the internal short circuit in the electric power storage device is determined based on the temporal change in the current or the stable current value of the current and not a voltage decrease amount. Accordingly, the electric power storage device can be inspected for the internal short circuit using a new method that uses the current flowing to the electric power storage device from the external electric power supply.

As will be described below, the method of inspecting the electric power storage device for a short circuit can not only be implemented in the course of manufacturing the electric power storage device but also be implemented for an electric power storage device that is mounted in a vehicle and the like or has been used alone after becoming available on the market. The "electric power storage device" is exemplified by, for example, a battery such as a lithium ion secondary battery and a capacitor such as an electric double-layer capacitor and a lithium ion capacitor.

The method of determining the internal short circuit based on the "stable current value" in the "determining" is exemplified by, for example, a method of determining that the electric power storage device is a defective product when the stable current value of the inspected electric power storage device is higher than a reference current value. A method of determination by dividing the degree of the internal short circuit in the electric power storage device into ranks based on the magnitude of the stable current value is also an example. The method of determining the internal short circuit based on the "temporal change in the current" is exemplified by a method of determining that the electric power storage device is a defective product when the current increase amount of the current that is increased in a predetermined detection period is larger than a reference increase amount. A method of determination by dividing the degree of the internal short circuit in the electric power storage device into ranks based on the magnitude of the current increase amount is also an example.

For example, the "pre-charged electric power storage device" may be the electric power storage device that is charged to 70% state-of-charge (SOC) or higher and particularly, may be the electric power storage device that is charged to 90% SOC or higher. When the charging state is set to be high (the device voltage is set to be high) as above, the value of the current or the stable current value detected in the current detecting is increased. Thus, the internal short circuit can be more appropriately determined based on the temporal change in the current or the stable current value of the current in the determining.

In the method according to the first aspect of the present disclosure, the voltage measuring and the current detecting may be performed under a condition that a device temperature of the electric power storage device is equal to a device inspection temperature as a constant temperature.

A determination is made that when the device temperature is changed, the device voltage and the current and the stable current value detected in the current detecting are also changed. Thus, when the change in device temperature is excessive in the voltage measuring and the current detecting, there is a possibility that the internal short circuit may not be appropriately determined in the determining. Regarding such a point, in the method of inspection for a short circuit, the voltage measuring and the current detecting are performed under a condition of the device inspection temperature as a constant temperature. Thus, the internal short circuit can be appropriately determined in the determining without posing such a problem.

The "device inspection temperature as a constant temperature" does not need to be a preset temperature (for example, 20° C.) for any electric power storage device subjected to the voltage measuring and the current detecting, that is, does not need to be the same temperature for each electric power storage device. That is, the device inspection temperature may be different, for example, 19° C. and 21° C., for each electric power storage device. However, for one electric power storage device, the device inspection temperature is desirably constant through the voltage measuring and the current detecting.

It is not easy to maintain the device inspection temperature at exactly the same temperature during the voltage measuring and the current detecting. Since a change in device temperature that does not impede short circuit detection is allowed, the "constant temperature" refers to the device temperature within an allowed temperature change range (for example, within 20° C.±0.5° C.) that may be regarded as the same temperature (in the present specification, the "same temperature" includes the meaning of "substantially the same temperature"). For example, the "device inspection temperature" may be a constant temperature selected from a temperature range of 0° C. to 30° C. The reason is that the electric power storage device does not need to be cooled or heated to room temperature or a temperature close to room temperature, or the energy of electric power and the like for cooling or heating can be reduced.

The method according to the first aspect of the present disclosure may further include device temperature checking of measuring the device temperature of the electric power storage device a plurality of number of times at intervals before the voltage measuring and in parallel with the voltage measuring and the current detecting in the middle of the voltage measuring and the current detecting, and continuing the voltage measuring and the current detecting when a change in the acquired device temperature is within an allowed temperature change range.

The method of inspection for a short circuit includes the device temperature checking. Thus, the voltage measuring and the current detecting can be continued merely when the change in device temperature falls within the allowed temperature change range. Accordingly, the voltage measuring and the current detecting can be performed by setting the device temperature of the electric power storage device to the device inspection temperature as a constant temperature.

The method according to the first aspect of the present disclosure may further include ambient temperature checking of measuring an ambient temperature of the electric power storage device a plurality of number of times at intervals before the voltage measuring and in parallel with the voltage measuring and the current detecting in the middle of the voltage measuring and the current detecting, and continuing the voltage measuring and the current detecting when a change in the acquired ambient temperature is within an allowed temperature change range.

As described above, when the change in device temperature is excessive in the voltage measuring and the current detecting, there is a possibility that the internal short circuit may not be appropriately determined in the determining. The ambient temperature does not directly affect the determination of the internal short circuit unlike the device temperature. However, when the ambient temperature is changed, the device temperature is also changed afterwards. Thus, the change in ambient temperature may affect the determination of the internal short circuit in the determining. Regarding such a point, the method of inspection for a short circuit includes the ambient temperature checking, and the voltage measuring and the current detecting are continued when the change in ambient temperature is within the allowed temperature change range. Thus, the internal short circuit can be appropriately determined in the subsequent determining.

The ambient temperature does not need to be the same temperature for each electric power storage device. That is, the ambient temperature may be different, for example, 19° C. and 21° C., for each electric power storage device. In such a case, whether or not the change in ambient temperature is within the allowed temperature change range is determined for each electric power storage device.

The method according to the first aspect of the present disclosure may further include high temperature aging of placing the pre-charged electric power storage device under a condition of an ambient temperature of 40° C. to 85° C. for a preset placing time period before the voltage measuring, and cooling of setting the device temperature of the electric power storage device to the device inspection temperature by forced cooling or placed cooling after the high temperature aging.

It is not desirable that the device voltage of the electric power storage device be unstable in the voltage measuring. Regarding such a point, the method of inspection for a short circuit includes the high temperature aging before the voltage measuring. Stabilization of the device voltage can be promoted by performing the high temperature aging. Thus, the voltage measuring and the current detecting can be more promptly performed than when the high temperature aging is not performed. The device temperature of the electric power storage device is set to the device inspection temperature by performing the cooling after the high temperature aging. Thus, the voltage measuring can be performed for the electric power storage device set to the device inspection temperature.

In the high temperature aging, the ambient temperature and the length of the high temperature placing time period in the high temperature aging may be set to a temperature and a length with which the magnitude of a possible change in battery voltage during the period of the current detecting (for example, three hours) for a battery after the high temperature aging and the cooling is expected to fall within an allowed range (for example, the detection precision of a voltmeter).

The method according to the first aspect of the present disclosure may further include placing of setting the device temperature of the electric power storage device to the device inspection temperature by placing the pre-charged electric power storage device under a condition of an ambient temperature equal to the device inspection temperature before the voltage measuring.

As described above, it is not desirable that the device voltage of the electric power storage device be unstable in the voltage measuring. Regarding such a point, the device voltage can be stabilized by performing the placing before the voltage measuring in the method of inspection for a short circuit. Thus, the voltage measuring can be performed for the electric power storage device of which the device voltage is stabilized. The device temperature of the electric power storage device is set to the device inspection temperature in the placing. Thus, the voltage measuring can be performed for the electric power storage device set to the device inspection temperature.

In the placing, the length of a placing time period may be set to a length with which the magnitude of a possible change in battery voltage during the period of the current detecting (for example, three hours) for a battery after the end of the placing is expected to fall within an allowed range (for example, the detection precision of a voltmeter).

In the method according to the first aspect of the present disclosure, the voltage measuring and the current detecting may be performed in a state where a positive electrode plate, a negative electrode plate, and a separator interposed between the positive electrode plate and the negative electrode plate in the electric power storage device are compressed in a thickness direction of the separator at a preset compression force from an outside of the electric power storage device.

In the voltage measuring and the current detecting, when the positive electrode plate, the separator, and the negative electrode plate of the electric power storage device are compressed as described above, the distance between the positive electrode plate and the negative electrode plate is decreased, and a metallic foreign object that is present between the positive electrode plate and the negative electrode plate is more securely brought into contact with the positive electrode plate or the negative electrode plate. Accordingly, the current that flows to the electric power storage device due to the internal short circuit caused by the metallic foreign object can be more appropriately measured.

The "compression in the thickness direction of the separator" refers to compression in the stack direction of the positive electrode plate, the separator, and the negative electrode plate when the electric power storage device includes a stacked electrode body in which a plurality of positive electrode plates having a rectangular shape and the like and a plurality of negative electrode plates having a rectangular shape and the like are stacked through the separator. When the electric power storage device includes a flat wound electrode body in which a band-shaped positive electrode plate and a band-shaped negative electrode plate that are alternately stacked through a band-shaped separator are wound into a flat shape, the "compression in the thickness direction of the separator" refers to compression in the thickness direction of the flat wound body in which most of the band-shaped separator is compressed in its thickness direction.

A second aspect of the present disclosure relates to a method of manufacturing an electric power storage device. The method includes first-time charging of charging an assembled non-charged electric power storage device for the first time to a preset charging state to acquire a pre-charged electric power storage device, and inspecting of inspecting the electric power storage device for a short circuit using the method according to the first aspect.

In the method of manufacturing the electric power storage device, the inspecting is performed after the first-time charging using the method of inspection for a short circuit including the voltage measuring and the current detecting. Thus, the electric power storage device that is appropriately inspected for the presence or degree of a short circuit in the early stage of the electric power storage device can be manufactured.

In the "first-time charging", for example, the electric power storage device may be charged to 70% SOC or higher and particularly, may be charged to 90% SOC or higher. When the charging state is set to be high (the device voltage is set to be high) as above, the value of the current or the stable current value detected in the current detecting is increased. Thus, the internal short circuit can be more appropriately determined based on the temporal change in the current or the stable current value of the current in the determining.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

First Embodiment

Figure 1:
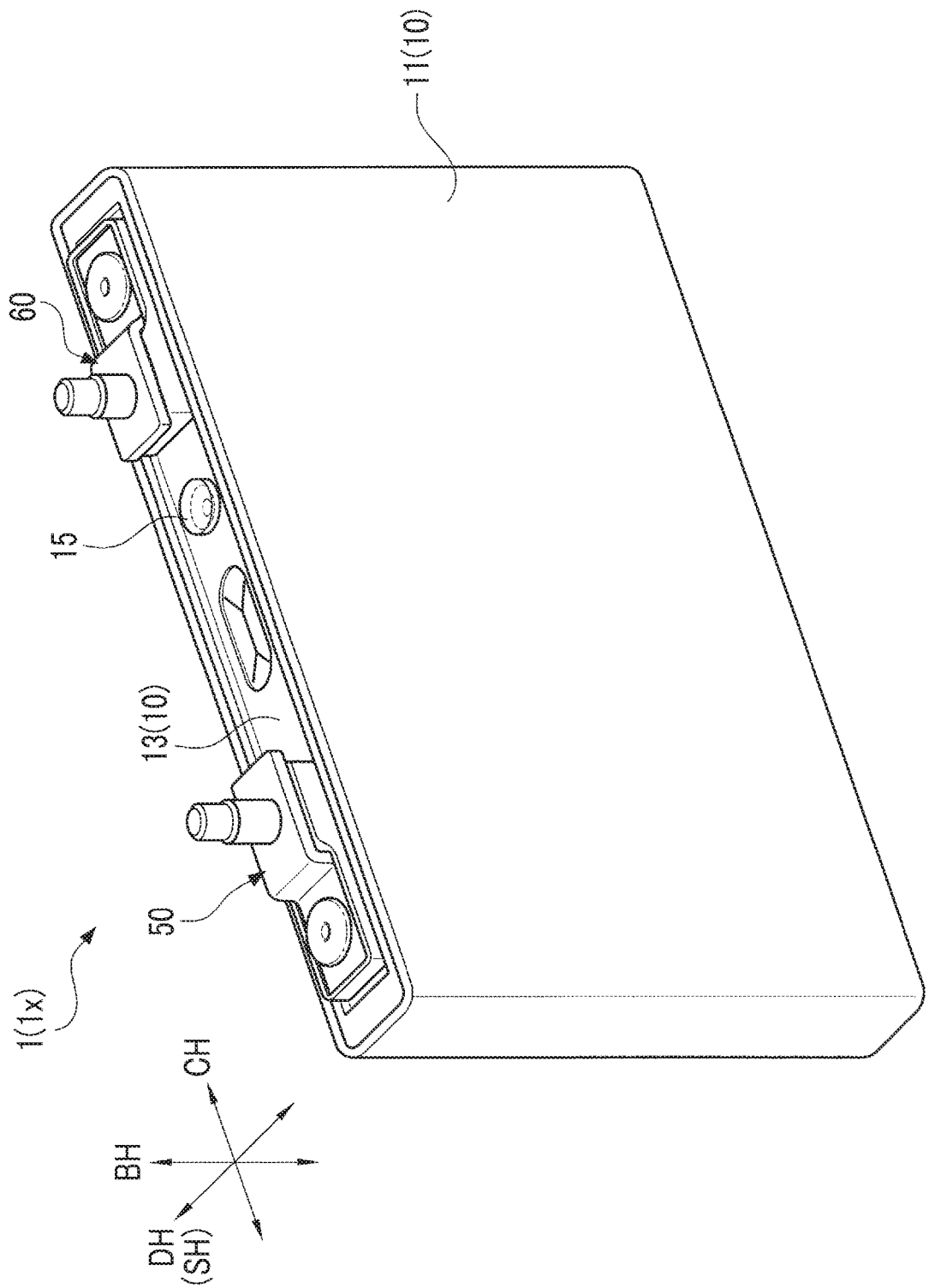
FIG. 1 is a perspective view of a battery according to a first embodiment.
Figure 2:
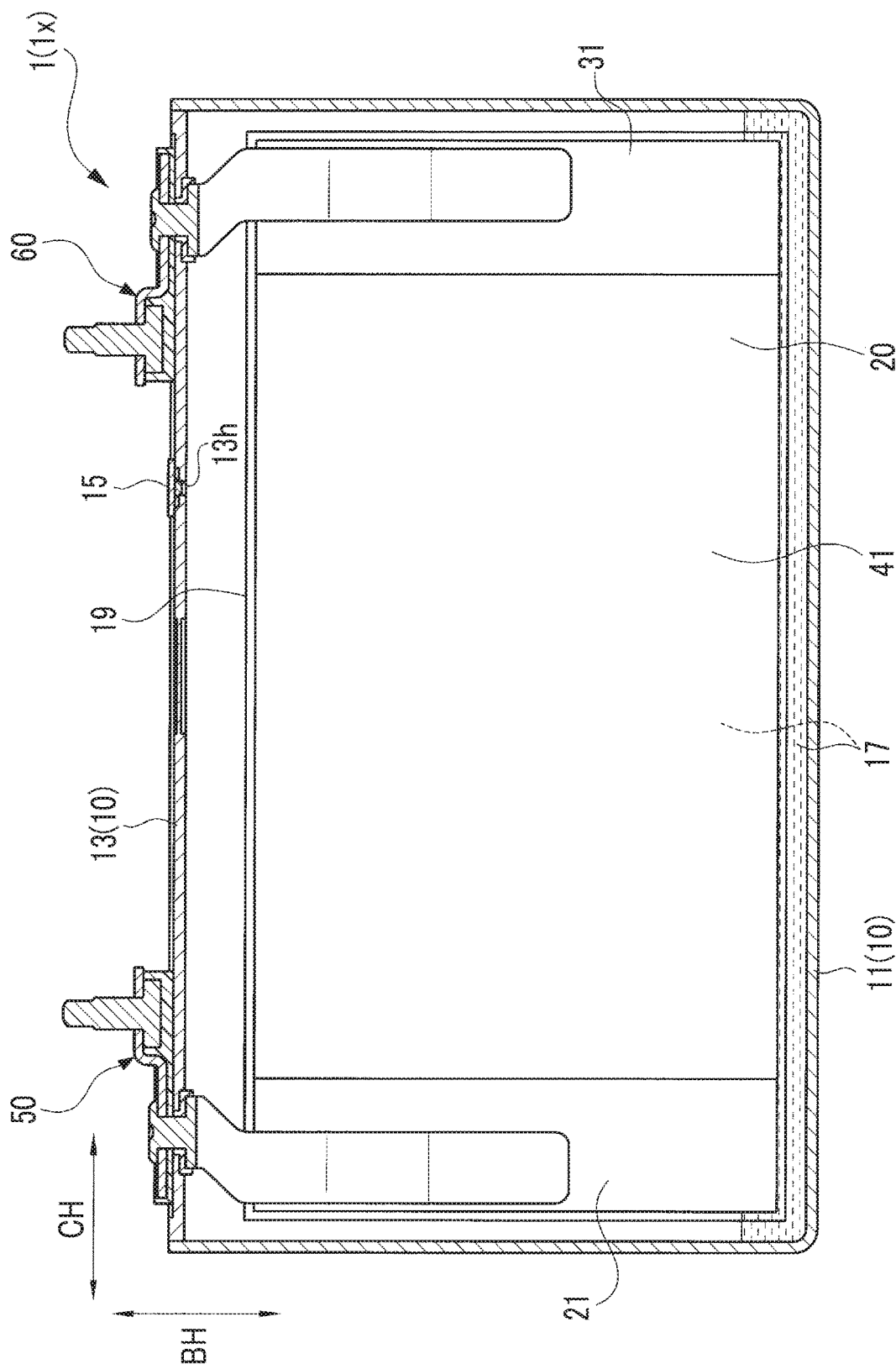
FIG. 2 is a vertical sectional view of the battery according to the first embodiment.

Hereinafter, a first embodiment of the present disclosure will be described with reference to the drawings. FIG. 1 and FIG. 2 are respectively a perspective view and a vertical sectional view of a battery (electric power storage device) 1 according to the first embodiment. In the following description, a vertical battery direction BH, a horizontal battery direction CH, and a battery thickness direction DH of the battery 1 are set to directions illustrated in FIG. 1 and FIG. 2.

The battery 1 is a cornered airtight lithium ion secondary battery that is mounted in a vehicle such as a hybrid car, a plug-in hybrid car, and an electric vehicle. A battery capacity of the battery 1 is 5.0 Ah. The battery 1 is configured with a battery case 10, an electrode body 20 accommodated in the battery case 10, and a positive electrode terminal member 50, a negative electrode terminal member 60, and the like supported by the battery case 10. A liquid electrolyte 17 is accommodated in the battery case 10. A part of the liquid electrolyte 17 is impregnated in the electrode body 20.

The battery case 10 is made of metal (in the first embodiment, aluminum) in a rectangular parallelepiped shape. The battery case 10 is configured with a cornered cylindrical case main body member 11 that has a bottom and is open merely on its upper side, and a rectangular plate-shaped case lid member 13 that is welded in the form of closing the opening of the case main body member 11. The positive electrode terminal member 50 that is made of aluminum is fixed to the case lid member 13 in a state where the positive electrode terminal member 50 is insulated from the case lid member 13. The positive electrode terminal member 50 is connected and conducted to a positive electrode plate 21 of the electrode body 20 in the battery case 10, and extends to the outside of the battery through the case lid member 13. The negative electrode terminal member 60 that is made of copper is fixed to the case lid member 13 in a state where the negative electrode terminal member 60 is insulated from the case lid member 13. The negative electrode terminal member 60 is connected and conducted to a negative electrode plate 31 of the electrode body 20 in the battery case 10, and extends to the outside of the battery through the case lid member 13.

The electrode body 20 is a flat wound electrode body and is accommodated in the battery case 10 in a state where the axis line of the electrode body 20 is horizontally disposed. A pouch-shaped insulation film enclosing body 19 that is configured with an insulation film is disposed between the electrode body 20 and the battery case 10. The electrode body 20 is configured by alternately stacking the band-shaped positive electrode plate 21 and the band-shaped negative electrode plate 31 through a pair of band-shaped separators 41 configured with a porous resin film, winding the stack about the axis line, and compressing the wound stack into a flat shape. The positive electrode plate 21 is configured by disposing a positive electrode active substance layer in a band shape at a predetermined position on both main surfaces of positive electrode current collecting foil configured with band-shaped aluminum foil. The positive electrode active substance layer is configured with a positive electrode active substance, a conductive material, and a binding agent. In the first embodiment, lithium transition metal complex oxide, specifically, lithium nickel cobalt manganese-based complex oxide, is used as the positive electrode active substance. The negative electrode plate 31 is configured by disposing a negative electrode active substance layer in a band shape at a predetermined position on both main surfaces of negative electrode current collecting foil configured with band-shaped copper foil. The negative electrode active substance layer is configured with a negative electrode active substance, a binding agent, and a thickening agent. In the first embodiment, a carbon material, specifically, graphite, is used as the negative electrode active substance.

Figure 3:
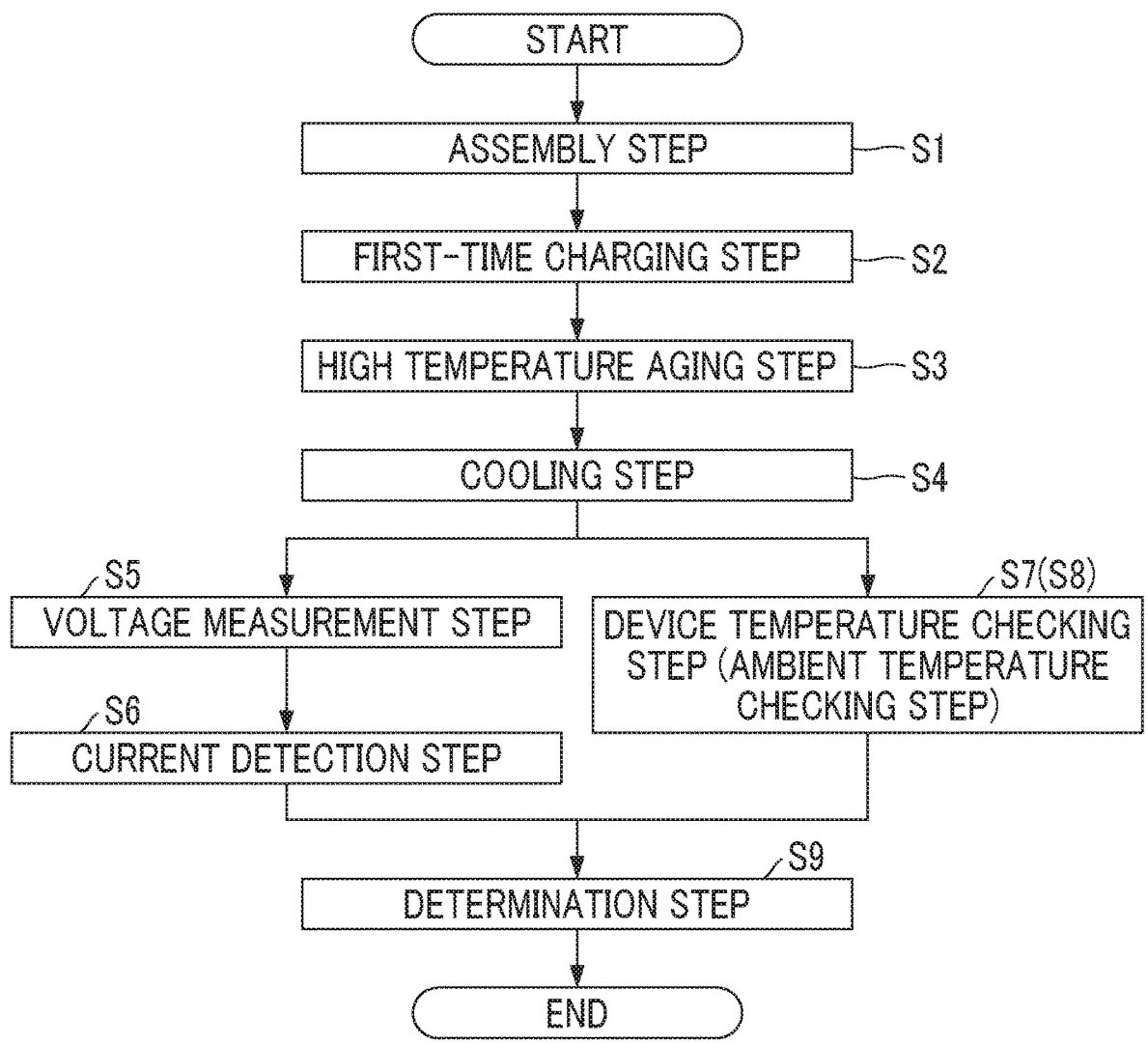
FIG. 3 is a flowchart of a method of manufacturing the battery including a method of inspecting the battery for a short circuit according to the first embodiment and first and second modification examples.

A method of manufacturing the battery 1 including a method of inspecting the battery 1 for a short circuit will be described (refer to FIG. 3). In "assembly step S1", a non-charged battery (non-charged electric power storage device) 1x is assembled. Specifically, the electrode body 20 is formed by alternately stacking the positive electrode plate 21 and the negative electrode plate 31 through the separators 41, winding the stack, and compressing the wound stack into a flat shape. Meanwhile, the case lid member 13 is prepared, and the positive electrode terminal member 50 and the negative electrode terminal member 60 are fixed to the case lid member 13 (refer to FIG. 1 and FIG. 2). Then, the positive electrode terminal member 50 and the negative electrode terminal member 60 are welded to the positive electrode plate 21 and the negative electrode plate 31 of the electrode body 20 respectively. The electrode body 20 is covered with the insulation film enclosing body 19. The electrode body 20 and the insulation film enclosing body 19 are inserted into the case main body member 11, and the opening of the case main body member 11 is closed with the case lid member 13. The case main body member 11 and the case lid member 13 are welded together to form the battery case 10. Then, the liquid electrolyte 17 is introduced into the battery case 10 from a liquid introduction hole 13h and is impregnated in the electrode body 20. Then, the liquid introduction hole 13h is sealed with a sealing member 15, and the non-charged battery 1x is completed.

Figure 4:
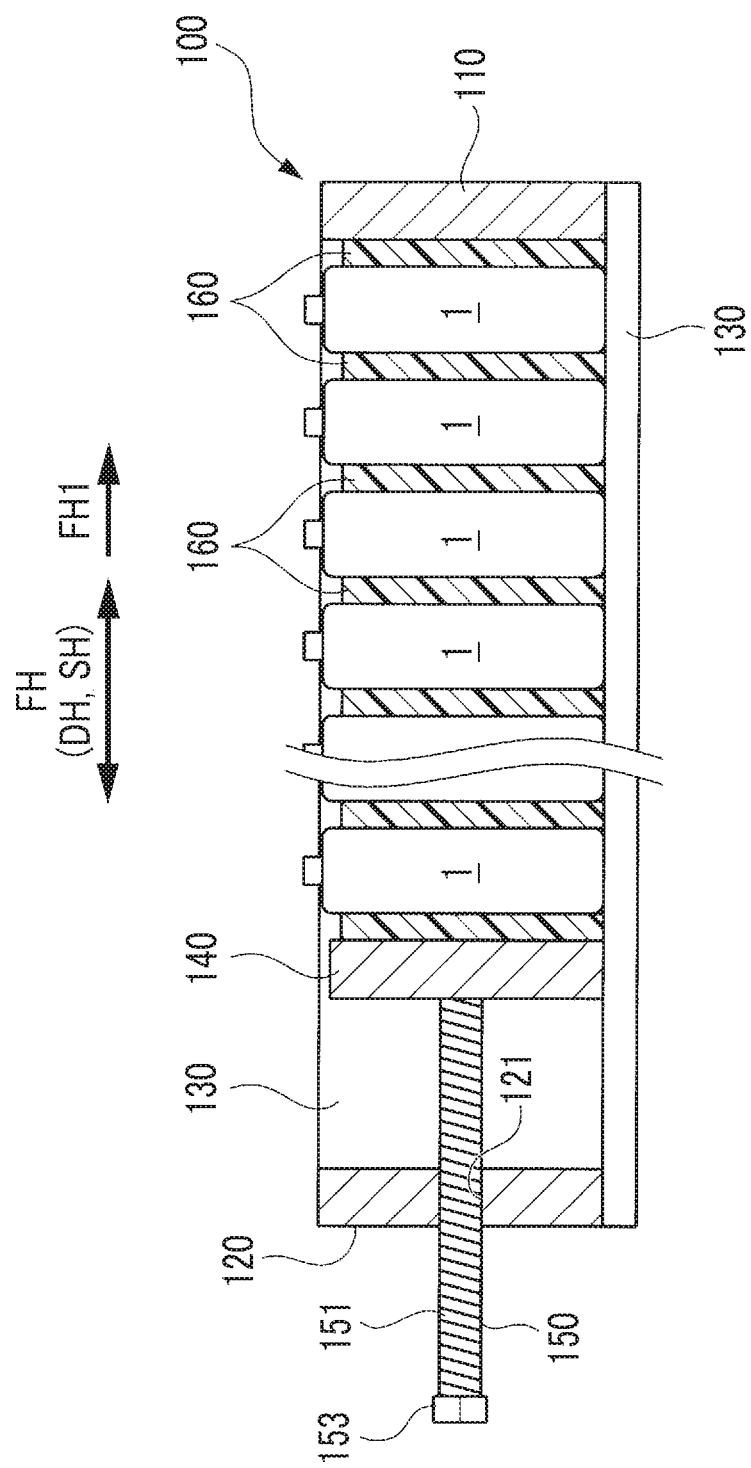
FIG. 4 is a descriptive diagram according to the first embodiment, illustrating a state where the batteries are compressed in a battery thickness direction.

Before "first-time charging step S2", the positive electrode plate 21, the negative electrode plate 31, and the separators 41 (electrode body 20) interposed between the positive electrode plate 21 and the negative electrode plate 31 in the assembled non-charged battery 1x are compressed in a thickness direction SH of each separator 41 at a preset compression force from the outside of the non-charged battery 1x. The compression of the battery 1 is performed using a restraining jig 100 (refer to FIG. 4). The restraining jig 100 is a jig that restrains a plurality of batteries 1 arranged in the battery thickness direction DH (the thickness direction SH of each separator 41) in a state where the compression force is applied to the batteries 1 in an arrangement direction FH.

The restraining jig 100 includes a first end plate 110 and a second end plate 120, a plurality of plate-shaped connecting members 130, a movable plate 140, a bolt 150, and a plurality of spacers 160. The first end plate 110 and the second end plate 120 are positioned at both ends of the restraining jig 100 in the arrangement direction FH. The connecting members 130 connect the first end plate 110 to the second end plate 120. The movable plate 140 is positioned between the first end plate 110 and the second end plate 120, and can be moved in the arrangement direction FH. The bolt 150 fastens the movable plate 140. A female thread hole 121 that passes through the second end plate 120 in the thickness direction of the second end plate 120 is formed at the center of the second end plate 120. The bolt 150 is inserted into the female thread hole 121 in the form of screwing a male thread portion 151 of the bolt 150 into the female thread hole 121.

The compression of the battery 1 using the restraining jig 100 is performed as follows. The batteries 1 and the spacers 160 are alternately arranged in the battery thickness direction DH (arrangement direction FH) between the first end plate 110 and the movable plate 140. Then, the bolt 150 is moved in a first arrangement direction FH1 by rotating a head portion 153 of the bolt 150 while the male thread portion 151 of the bolt 150 is screwed into the female thread hole 121 of the second end plate 120. The movable plate 140 is fastened by bringing the tip end of the male thread portion 151 of the bolt 150 into contact with the movable plate 140. The movable plate 140 compresses each battery 1 by pressing each battery 1 at a predetermined pressure in the arrangement direction FH with the arranged batteries 1 and the spacers 160 interposed between the movable plate 140 and the first end plate 110. Accordingly, the electrode body 20 is compressed in the thickness direction SH of each separator 41 (the thickness direction of the electrode body 20). In the first embodiment, "first-time charging step S2" to "current detection step S6" described below are performed in a state where the non-charged battery 1x (battery 1) is compressed.

In "first-time charging step S2", the assembled non-charged battery 1x is charged for the first time to a preset charging state. Specifically, a charging and discharging device (not illustrated) is connected to the non-charged battery 1x to charge the non-charged battery 1x for the first time to a battery voltage (device voltage) VB=4.1 V corresponding to 100% SOC by constant current constant voltage (CCCV) charging under a condition of ambient temperature TK=25° C. In the first embodiment, after the charging to the battery voltage VB=4.1 V at a constant current of 1 C, the battery voltage VB=4.1 V is maintained until a charging current value becomes 1/10.

Figure 7:
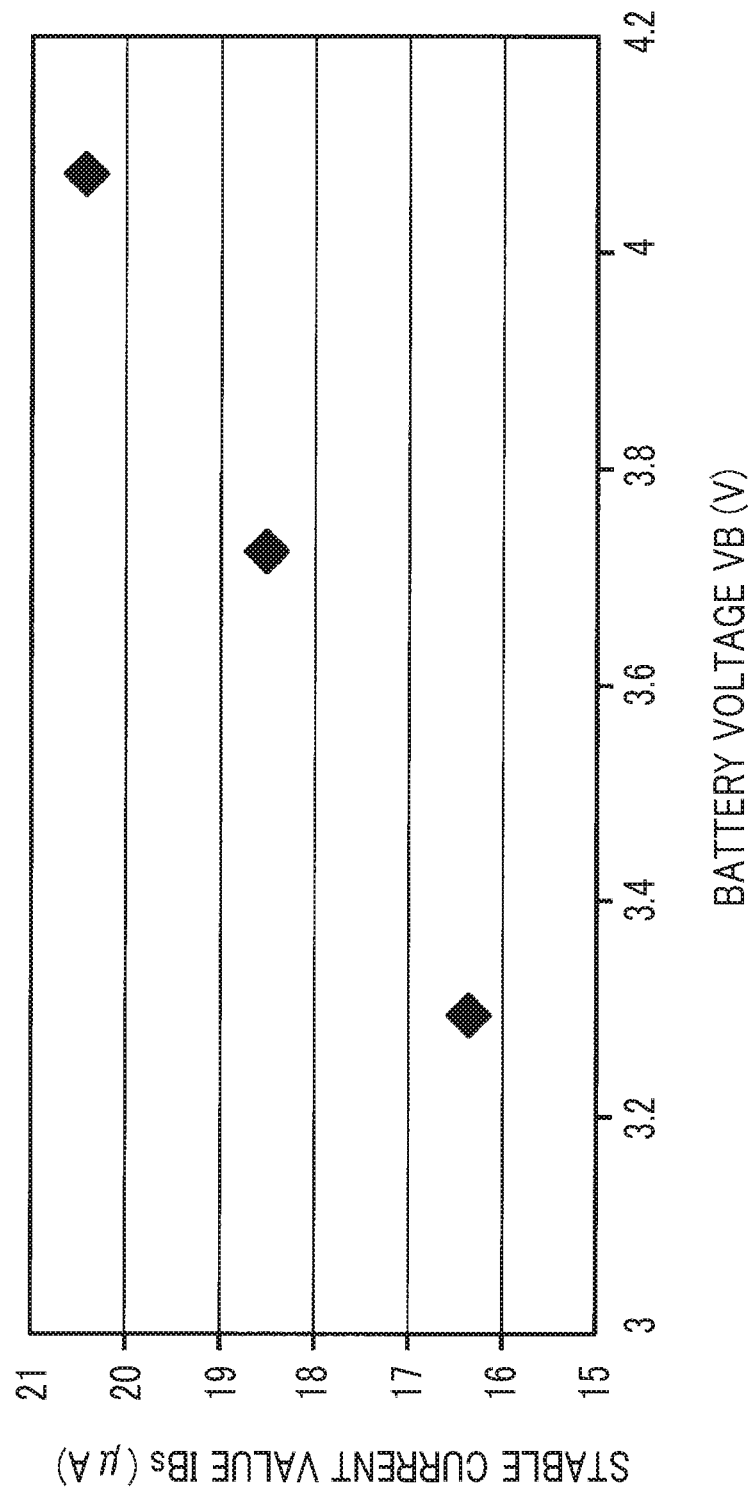
FIG. 7 is a graph illustrating a relationship between the battery voltage and a stable current value.

As illustrated in FIG. 7, as the battery voltage VB is increased, the value of a stable current value IBs detected in current detection step S6 described below is also increased. When the stable current value IBs is high, a determination of an internal short circuit based on the stable current value IBs in determination step S9 described below can be more appropriately performed. From such a reason, for example, it is preferable to charge the non-charged battery 1x to higher than or equal to 70% SOC and more preferably, higher than or equal to 90% SOC in first-time charging step S2.

In "high temperature aging step S3", the charged battery 1 is subjected to high temperature aging by placing the charged battery 1 under a temperature condition of ambient temperature TK=40° C. to 85° C. for a preset placing time period PT. Specifically, the battery 1 after the first-time charging is subjected to high temperature aging by placing the battery 1 under a condition of ambient temperature TK=60° C. for PT=20 hours in a state where all electrode terminals are open. Generally, the battery voltage VB of the battery 1 is unstable immediately after charging, and it takes time for the battery voltage VB to become stable. Regarding such a point, stabilization of the battery voltage VB can be promoted by performing high temperature aging step S3. Thus, the stabilized battery voltage VB (pre-detection battery voltage VB1) can be measured in voltage measurement step S5 described below in a shorter time period than when the battery 1 is simply placed.

In "cooling step S4", the battery 1 is subjected to placed cooling by placing the battery 1 under a condition of ambient temperature TK=20° C. that is equal to a battery inspection temperature (device inspection temperature) TB1 (in the first embodiment, TB1=20° C.), and the battery temperature (device temperature) TB of the battery 1 is set to the battery inspection temperature TB1=20° C.

By setting the battery temperature TB of the battery 1 to the battery inspection temperature TB1=20° C. through cooling step S4 after high temperature aging step S3, voltage measurement step S5 described below can be performed at the battery inspection temperature TB1=20° C. By setting the battery inspection temperature TB1 as a constant temperature (in the first embodiment, TB1=20° C.) selected from a temperature range of 0° C. to 30° C., the battery 1 does not need to be cooled or heated, or the energy of electric power and the like for cooling or heating the battery 1 can be reduced.

Before "voltage measurement step S5" described below, the (n=1)-th battery temperature TB(1) of the battery 1 is measured in "device temperature checking step S7". In device temperature checking step S7, not only the battery temperature TB(1) is measured before voltage measurement step S5, but also the battery temperature TB(n) is periodically measured in parallel with voltage measurement step S5 and current detection step S6 in the middle of voltage measurement step S5 and current detection step S6 described below. Specifically, after the (n=1)-th battery temperature TB(1) is measured, the (n=2)-th or subsequent battery temperature TB(n) is measured per second in parallel with voltage measurement step S5 and current detection step S6. The battery temperature TB(n) is detected in a temperature detection device STS by bringing a temperature sensor ST into contact with a predetermined position on the battery case 10 (refer to FIG. 5).

In device temperature checking step S7, whether or not a change in the battery temperature TB(n) with respect to the battery temperature TB(1) is within an allowed temperature change range DTB is checked. Specifically, in the first embodiment, whether or not the battery temperature TB(n) measured for the second or subsequent time falls within a range of ±0.5° C. with respect to the battery temperature TB(1) measured for the first time is checked. When the change in the battery temperature TB(n) is within the allowed temperature change range DTB, voltage measurement step S5 or current detection step S6 is continued. When the change in the battery temperature TB(n) falls outside the allowed temperature change range DTB, that is, when the battery temperature TB(n) measured for the second or subsequent time falls outside the range of ±0.5° C. with respect to the battery temperature TB(1) measured for the first time in the first embodiment, the execution of voltage measurement step S5 or current detection step S6 is stopped, and the inspection for a short circuit is ended. The inspection for a short circuit cannot be appropriately performed because the battery temperature TB has changed for any reason.

Figure 8:
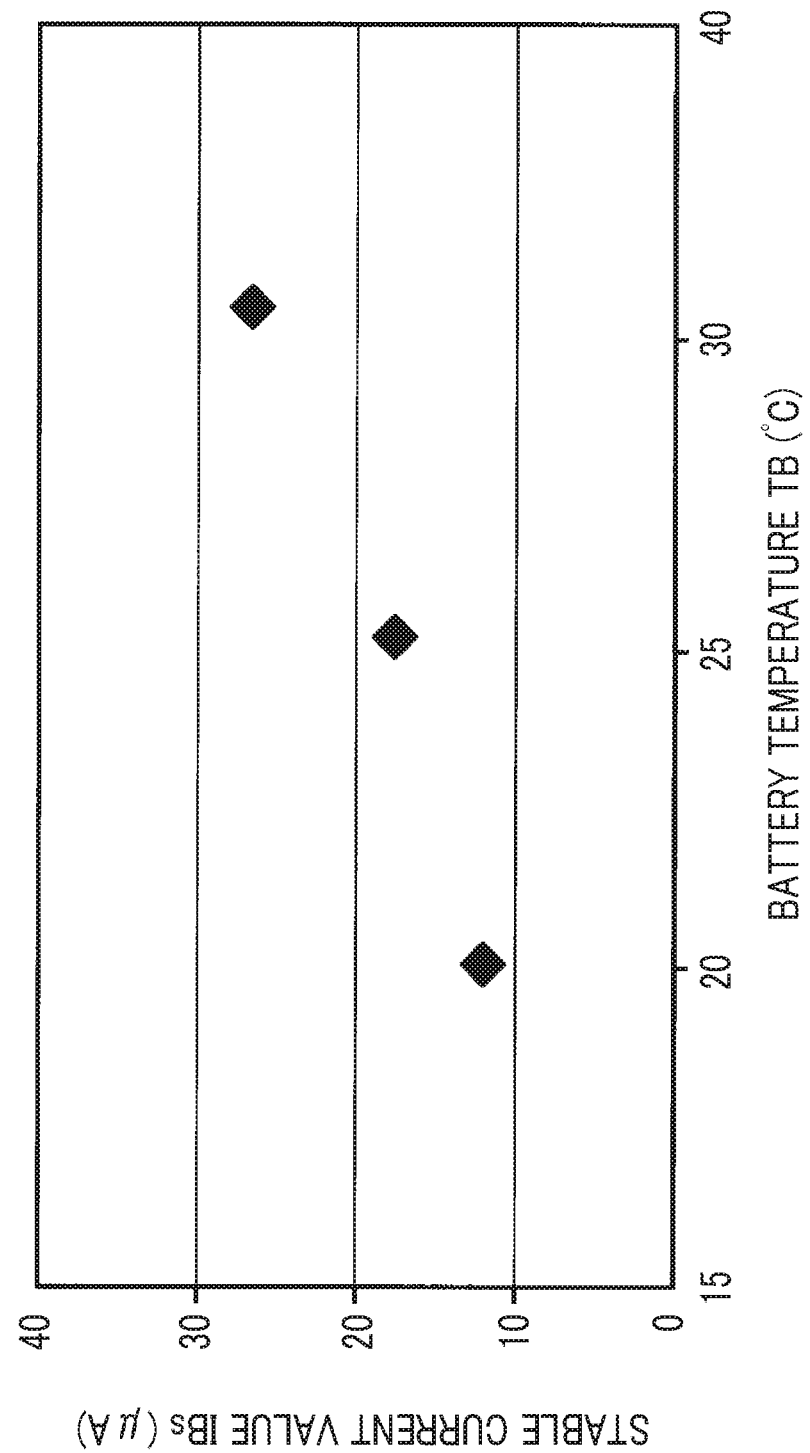
FIG. 8 is a graph illustrating a relationship between a battery temperature and the stable current value.

A determination is made that when the battery temperature TB is changed, the device voltage VB such as the pre-detection battery voltage (pre-detection device voltage) VB1 detected in voltage measurement step S5, and also a current IB and the stable current value IBs detected in current detection step S6 are changed. For example, as illustrated in FIG. 8, the stable current value IBs is increased as the battery temperature TB is increased. Thus, when the change in the battery temperature TB is excessive in voltage measurement step S5 and current detection step S6, there is a possibility that an internal short circuit may not be appropriately determined in determination step S9 described below. Regarding such a point, device temperature checking step S7 is included in the first embodiment, and an internal short circuit can be appropriately determined in determination step S9 without posing such a problem.

Figure 5:
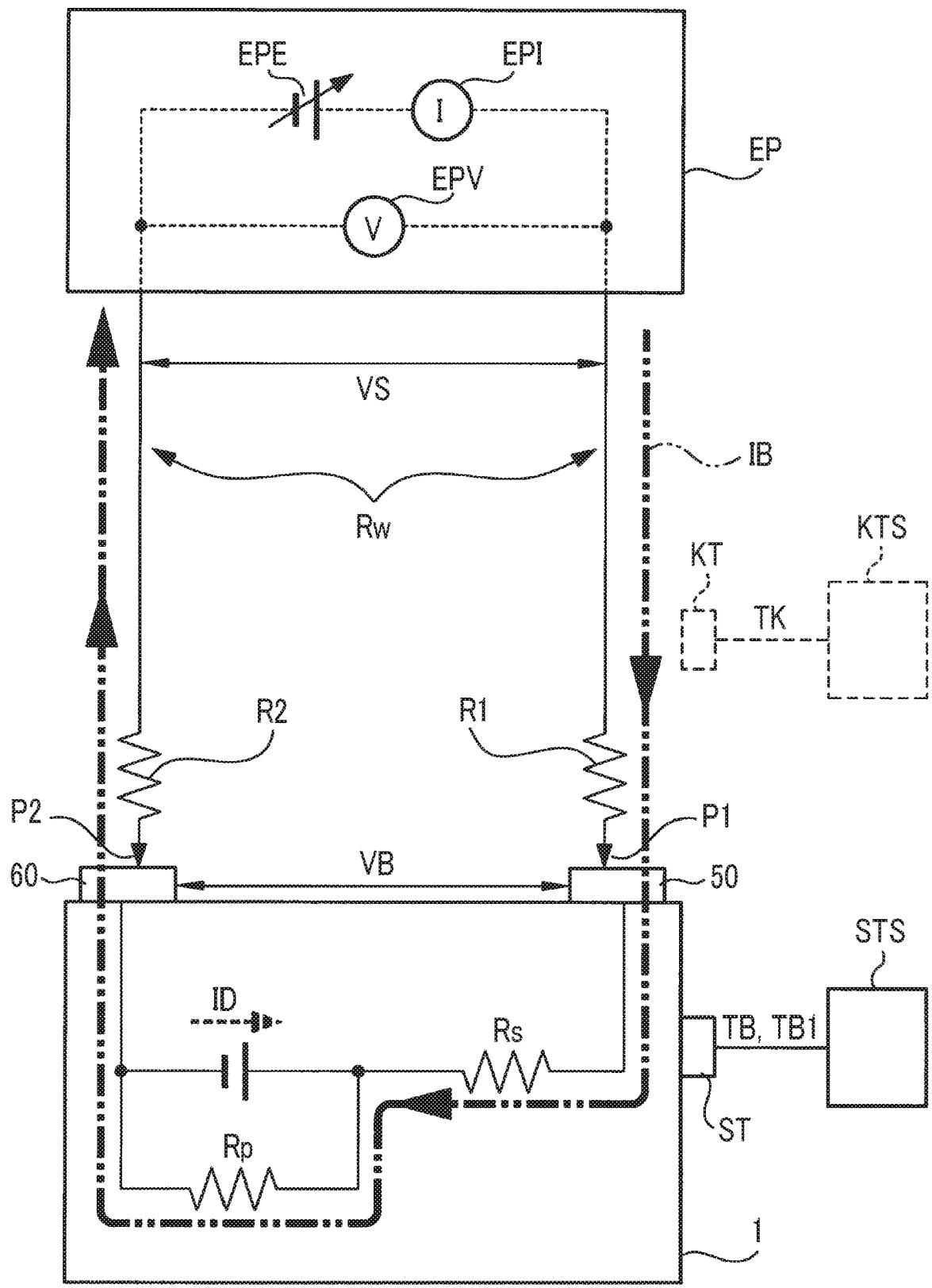
FIG. 5 is a circuit diagram related to the method of inspecting the battery for a short circuit according to the first embodiment, in a state where an external electric power supply is connected to the battery.

In "voltage measurement step S5", as illustrated in FIG. 5, an external electric power supply EP is connected to the battery 1, and the pre-detection battery voltage (pre-detection device voltage) VB1 of the battery 1 is measured. Specifically, a pair of probes P1, P2 of the external electric power supply EP is brought into contact with the positive electrode terminal member 50 and the negative electrode terminal member 60 of the battery 1 respectively. While such a contact state is maintained (the probes P1, P2 are not reconnected), voltage measurement step S5 and current detection step S6 described below are performed. The reason is that a change in the magnitude of each of contact resistances R1, R2 caused between the probe P1 and the positive electrode terminal member 50, and between the probe P2 and the negative electrode terminal member 60 due to a change in the contact state of each of the probes P1, P2 is avoided.

In FIG. 5, a wiring resistance Rw indicates a wiring resistance that is distributed in the external electric power supply EP and from the external electric power supply EP to the probes P1, P2. The contact resistance R1 is a contact resistance between the probe P1 of the external electric power supply EP and the positive electrode terminal member 50 of the battery 1. The contact resistance R2 is a contact resistance between the probe P2 of the external electric power supply EP and the negative electrode terminal member 60 of the battery 1. A battery resistance Rs a direct current resistance of the battery 1. A short circuit resistance Rp is a resistance that is caused by an internal short circuit in the battery 1. The current IB is a current that flows to the battery 1 from the external electric power supply EP. A current ID is a self-discharge current that flows in the battery 1 along with self-discharge. The external electric power supply EP is a precision direct current electric power supply that is configured to not only change and control an output voltage VS generated by its direct current electric power supply EPE with high precision, but also measure the current IB flowing to the outside from the direct current electric power supply EPE with high precision.

After the external electric power supply EP is connected to the battery 1 under a condition of ambient temperature TK=20° C., the battery voltage VB, that is, the pre-detection battery voltage VB1 (open-circuit voltage), of the battery 1 is measured using a voltmeter EPV included in the external electric power supply EP under a condition of current IB=0. In the first embodiment, a value around 4.0 V is measured as the pre-detection battery voltage VB1. The external electric power supply EP includes not only the voltmeter EPV that can measure the battery voltage VB, but also an ammeter EPI that can measure the current IB flowing to the battery 1 from the external electric power supply EP.

In "current detection step S6", the stable current value IBs of the current IB flowing to the battery 1 from the external electric power supply EP is detected by continuously applying the output voltage VS (VS=VB1) equal to the pre-detection battery voltage VB1 measured in voltage measurement step S5 to the battery 1 using the direct current electric power supply EPE of the external electric power supply EP. In the first embodiment, the current IB is detected at a time point (t=3.0 h) after the output voltage VS equal to the pre-detection battery voltage VB1 is applied to the battery 1 from the external electric power supply EP for a voltage application time t=3.0 hours under a condition of ambient temperature TK=20° C., and the detected current IB is used as the stable current value IBs.

Figure 6:
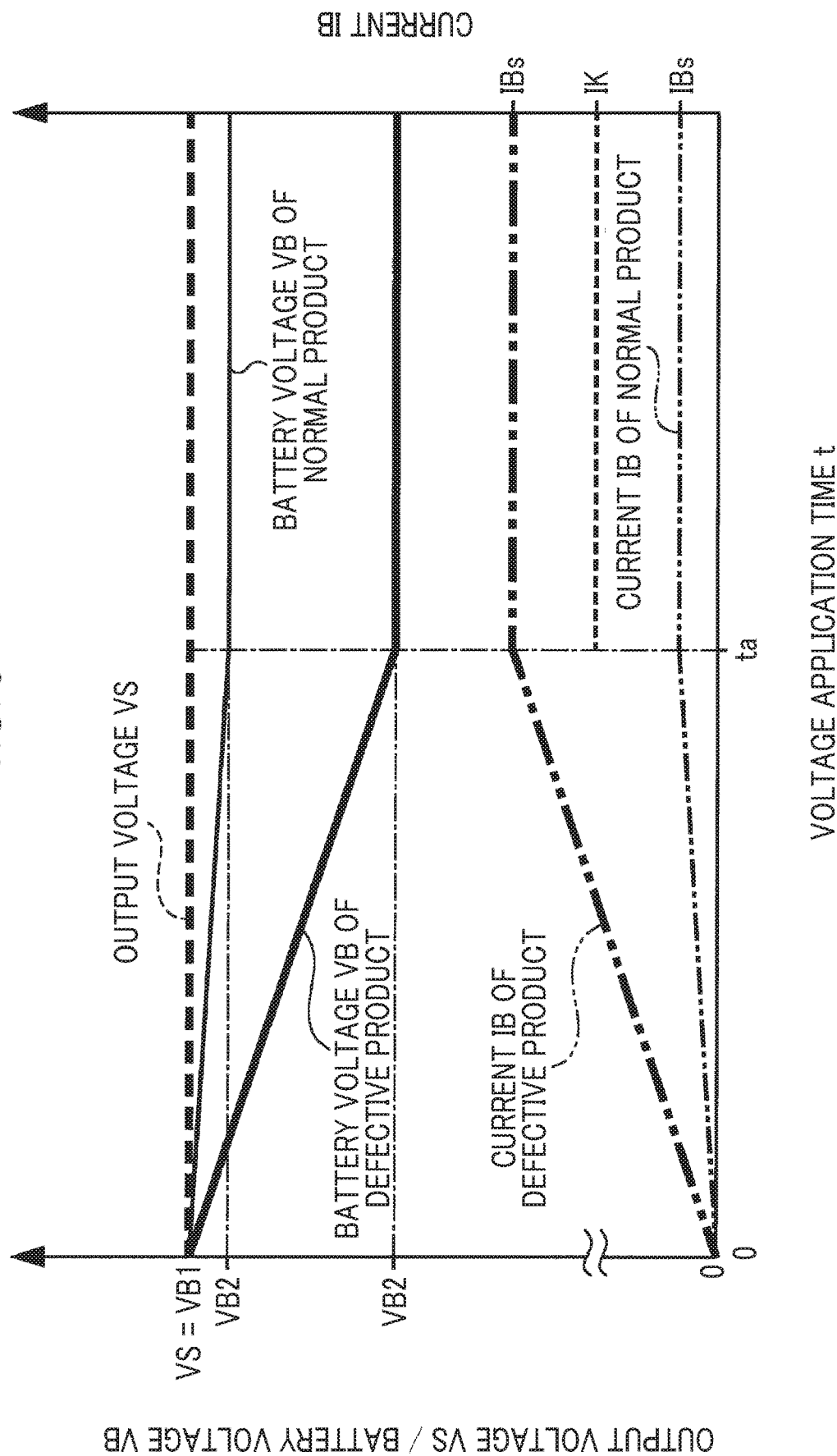
FIG. 6 is a graph schematically illustrating a relationship among a voltage application time, an output voltage, a battery voltage, and a current for each of a normal product and a defective product of the battery.

A relationship among the voltage application time t, the output voltage VS, the battery voltage VB, and the current IB in current detection step S6 is illustrated in FIG. 6 for each of a normal product and a defective product of the battery 1. The output voltage VS applied to the battery 1 from the external electric power supply EP has a magnitude equal to the pre-detection battery voltage VB1 measured in voltage measurement step S5 regardless of the elapse of the voltage application time t.

The value of the battery voltage VB is gradually decreased from the pre-detection battery voltage VB1 at the start of current detection step S6 along with the elapse of the voltage application time t and then, becomes constant (stable battery voltage VB2) after the voltage application time t=ta. The battery voltage VB of the defective product of the battery 1 is decreased more significantly than that of the normal product of the battery 1. Thus, the value of the stable battery voltage VB2 of the defective product of the battery 1 is lower than that of the normal product of the battery 1.

The reason for the change in the battery voltage VB is as follows. The current ID flows in the battery 1 by the self-discharge, and the battery voltage VB in the battery 1 is gradually decreased. In such a case, in the defective product of the battery 1, the current ID accompanied by the self-discharge is higher than that of the normal product of the battery 1, and the battery voltage VB is significantly decreased. When the battery voltage VB becomes lower than the output voltage VS (VS>VB), the current IB that corresponds to the magnitude of a voltage difference ΔV=VS−VB flows toward the battery 1 from the external electric power supply EP, and the battery 1 is charged. While the voltage difference ΔV=VS−VB is small, the current IB is also low. Thus, the current ID flowing in the battery 1 due to the self-discharge is higher than the current IB flowing into the battery 1 from the external electric power supply EP, and the battery voltage VB is gradually decreased. However, when the battery voltage VB is further decreased, and the current IB is increased to become equal to the magnitude of the current ID (IB=ID) (in FIG. 6, at the voltage application time t=ta), the battery voltage VB stops decreasing, and then, the battery voltage VB is maintained at the stable battery voltage VB2.

The value of the current IB that flows to the battery 1 from the external electric power supply EP is gradually increased from 0 (zero) along with the elapse of the voltage application time t and becomes constant (stable current value IBs) after the voltage application time t=ta. The reason for the change in the current IB is as follows.

At t=0 when the voltage application is started, the magnitudes of the battery voltage VB and the output voltage VS are equal to each other (VS=VB), and the current IB does not flow toward the battery 1 from the external electric power supply EP (IB=0). However, when the battery voltage VB is decreased due to the self-discharge, and the battery voltage VB becomes lower than the output voltage VS (VS>VB), the current IB that corresponds to the magnitude of the voltage difference ΔV=VS−VB flows to the battery 1 from the external electric power supply EP. In such a case, in the defective product of the battery 1, the current ID accompanied by the self-discharge is higher than that of the normal product of the battery 1, and the battery voltage VB is significantly decreased. Thus, the current IB flowing to the battery 1 from the external electric power supply EP is increased. After the voltage application time t=ta, the battery voltage VB becomes equal to the constant value of the stable battery voltage VB2, and the current IB is stabilized at the constant value of the stable current value IBs.

Figure 9:
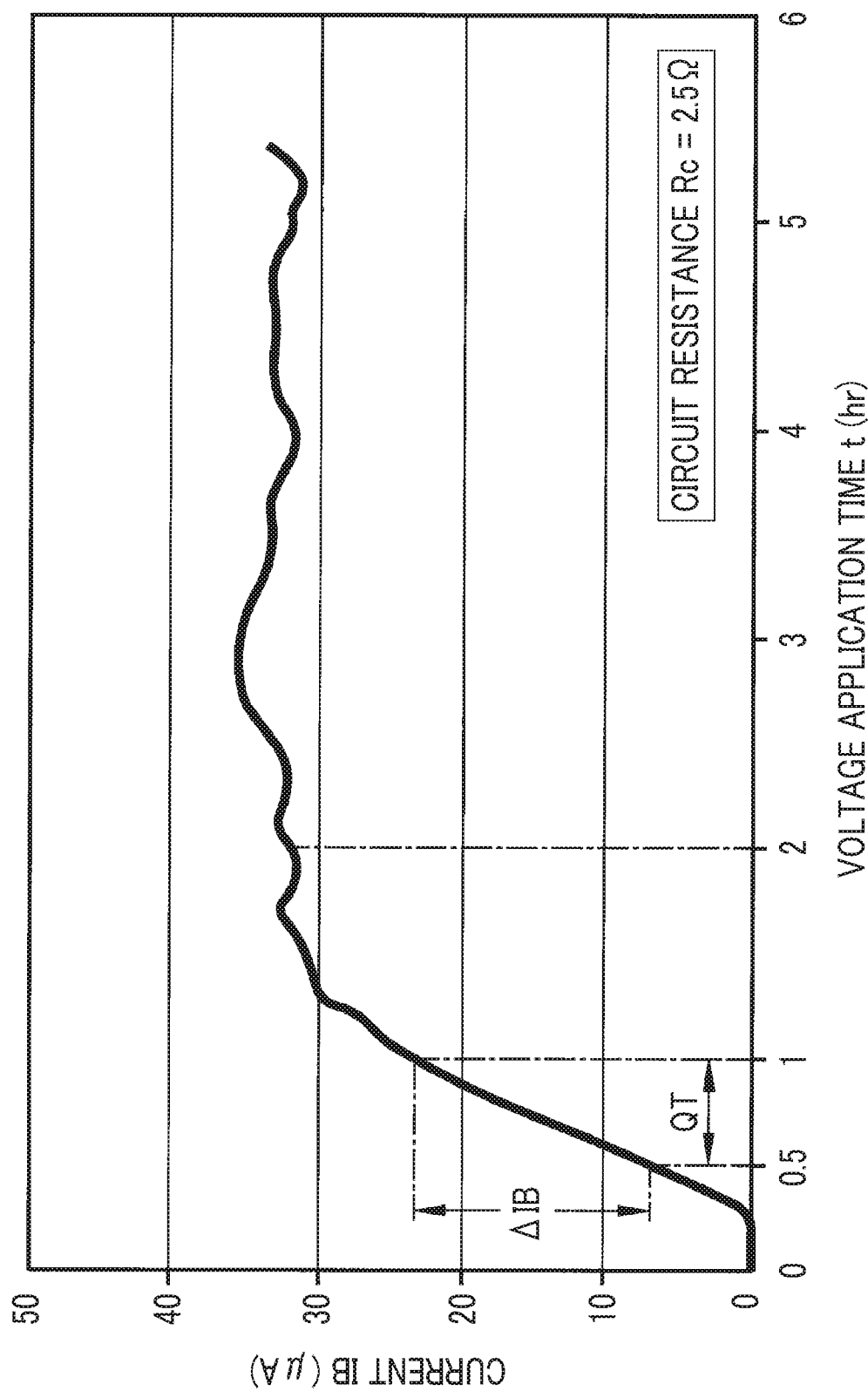
FIG. 9 is a graph illustrating a relationship between the voltage application time and the current when a circuit resistance is Rc=2.5 Ω.
Figure 10:
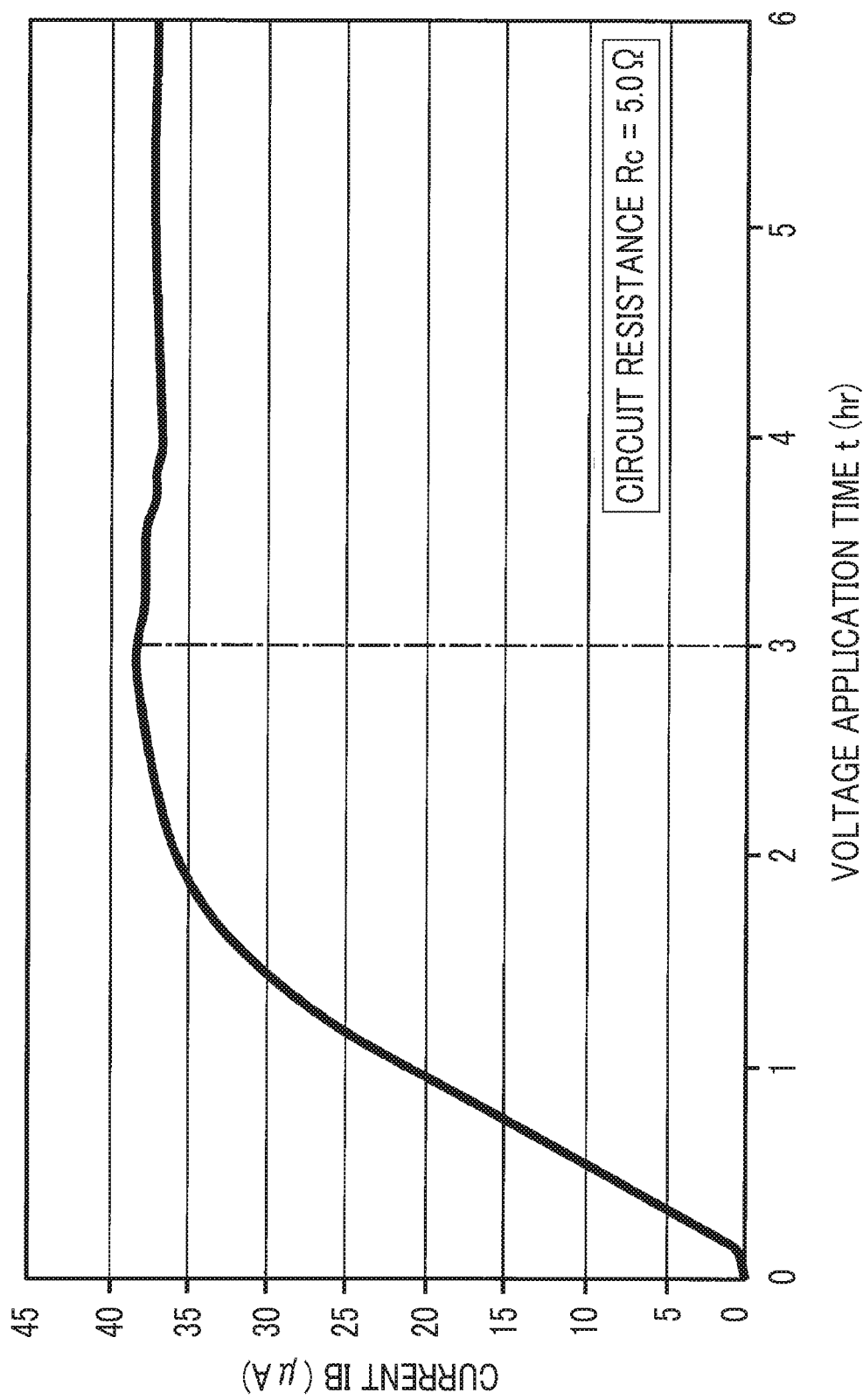
FIG. 10 is a graph illustrating a relationship between the voltage application time and the current when the circuit resistance is Rc=5.0Ω.

A determination is made that as a circuit resistance Rc is increased, the voltage application time ta that is taken until the current IB flowing to the battery 1 from the external electric power supply EP becomes equal to the stable current value IBs is increased (refer to FIG. 9 and FIG. 10). The circuit resistance Rc is the sum of the wiring resistance Rw, the contact resistances R1, R2, and the battery resistance (direct current resistance of the battery 1) Rs illustrated in FIG. 5 (Rc=Rw+R1+R2+Rs).

Even in the case of measuring the same battery 1, when the contact resistances R1, R2 are low, and the circuit resistance Rc is, for example, Rc=2.5Ω, the current IB becomes equal to the stabilized stable current value IBs after approximately two hours of the voltage application time t elapses (t≥2 h) as illustrated in FIG. 9. When the circuit resistance Rc is, for example, Rc=5.0Ω, the current IB becomes equal to the stabilized stable current value IBs after approximately three hours of the voltage application time t elapses (t≥3 h) as illustrated in FIG. 10. The maximum circuit resistance Rc in the battery 1 of the first embodiment is Rc=5.0Ω. Accordingly, the current IB is expected to become equal to the stable current value IBs after elapse of at least the voltage application time t=3 h. Thus, the timing of detecting the stable current value IBs in current detection step S6 is set to 3.0 hours as described above. After current detection step S6 is ended, the state of compressing the battery 1 using the restraining jig 100 is released.

In "determination step S9", an internal short circuit in the battery 1 is determined based on the magnitude of the stable current value IBs detected in current detection step S6. Specifically, when the stable current value IBs of the inspected battery 1 is higher than a reference current value IK (refer to FIG. 6) (IBs>IK), a determination is made that the battery 1 is a defective product, and the battery 1 is discarded. When the stable current value IBs is lower than or equal to the reference current value IK (IBs≤IK), a determination is made that the battery 1 is a normal product. Accordingly, the battery 1 is completed. Each of high temperature aging step S3 to determination step S9 in the first embodiment corresponds to "inspection step" of inspecting the battery 1 for an internal short circuit in manufacturing of the battery 1.

As described thus far, in the method of inspecting the battery 1 for a short circuit, voltage measurement step S5, current detection step S6, and the determination step S9 are performed, and an internal short circuit in the battery 1 is determined based on the stable current value IBs and not a voltage decrease amount ΔVa. Accordingly, the battery 1 can be inspected for an internal short circuit using a new method that uses the current IB flowing to the battery 1 from the external electric power supply EP. In inspection for a short circuit in the related art where an internal short circuit is determined based on the voltage decrease amount ΔVa, a period of a few days or longer is needed for acquiring the voltage decrease amount ΔVa having an appropriate magnitude. Meanwhile, in the first embodiment, it takes approximately three hours to acquire the stable current value IBs. Thus, the amount of time for inspecting the battery 1 for a short circuit can be decreased, and the amount of time for manufacturing the battery 1 can be decreased.

As described above, the values of the pre-detection battery voltage VB1 and the stable current value IBs become different from each other due to the difference in the battery temperature TB. Thus, when the change in the battery temperature TB is excessive in voltage measurement step S5 and current detection step S6, there is a possibility that an internal short circuit may not be appropriately determined in determination step S9. Regarding such a point, in the method of inspection for a short circuit in the first embodiment, voltage measurement step S5 and current detection step S6 are performed at the battery inspection temperature TB1 as a constant temperature (in the first embodiment, TB1=20° C.). Thus, an internal short circuit can be appropriately determined in determination step S9 without posing such a problem. The first embodiment includes device temperature checking step S7. Thus, voltage measurement step S5 and current detection step S6 can be continued merely when the change in the device temperature TB(n) falls within the allowed temperature change range DTB. Accordingly, voltage measurement step S5 and current detection step S6 can be performed by setting the battery temperature TB to the battery inspection temperature TB1 as a constant temperature.

It is not preferable that the battery voltage VB of the battery 1 be unstable in voltage measurement step S5. Regarding such a point, in the first embodiment, stabilization of the battery voltage VB can be promoted by performing high temperature aging step S3 before voltage measurement step S5. Thus, voltage measurement step S5 and current detection step S6 can be more promptly performed than when high temperature aging step S3 is not performed. Cooling step S4 is performed after high temperature aging step S3 to set the battery temperature TB to the battery inspection temperature TB1. Thus, voltage measurement step S5 can be performed for the battery 1 set to the battery inspection temperature TB1.

In the first embodiment, the positive electrode plate 21, the separators 41, and the negative electrode plate 31 of the battery 1 are compressed in the thickness direction SH of each separator 41. Thus, the distance between the positive electrode plate 21 and the negative electrode plate 31 is decreased, and a metallic foreign object present between the positive electrode plate 21 and the negative electrode plate 31 is more securely brought into contact with the positive electrode plate 21 or the negative electrode plate 31. Accordingly, the current IB that flows to the battery 1 due to an internal short circuit caused by the metallic foreign object can be more appropriately measured.

As described above, the method of manufacturing the battery 1 in the first embodiment includes first-time charging step S2 of charging the non-charged battery 1x for the first time, and inspection steps S3 to S9 of inspecting the battery 1 for an internal short circuit. Accordingly, by performing inspection steps S3 to S9 after first-time charging step S2, the battery 1 that is appropriately inspected for an internal short circuit in the early stage of the battery 1 can be manufactured.

First Modification Example

A first modification example of the first embodiment will be described. In the first embodiment, the stable current value IBs of the current IB flowing to the battery 1 from the external electric power supply EP is detected in current detection step S6, and an internal short circuit in the battery 1 is determined based on the stable current value IBs in determination step S9. Regarding such a point, in the first modification example, an internal short circuit in the battery 1 is determined based on a temporal change in the current IB flowing to the battery 1 from the external electric power supply EP.

In the first modification example, in current detection step S6, the stable current value IBs of the current IB flowing to the battery 1 from the external electric power supply EP is not detected, and a temporal change in the current IB is detected. Specifically, a temporal change in the current IB is detected, and a current increase amount ΔIB of the current IB that is increased in a predetermined detection period QT from the voltage application time t=0.5 hours to t=1.0 hour is acquired as illustrated in FIG. 9. In determination step S9, when the current increase amount ΔIB is larger than a reference increase amount ΔIBk (ΔIB>ΔIBk), a determination is made that the battery 1 is a defective product. When the current increase amount ΔIB is smaller than or equal to the reference increase amount ΔIBk (ΔIB≤ΔIBk), a determination is made that the battery 1 is a normal product.

As described above, an internal short circuit in the battery 1 can also be determined based on the temporal change in the current IB flowing to the battery 1 from the external electric power supply EP. Accordingly, the method of inspection for a short circuit in the first modification example can also be used for inspecting the battery 1 for an internal short circuit as a new method using the current IB. In the first modification example, the output voltage VS may be simply applied until the voltage application time t=1.0 hour in order to acquire the current increase amount ΔIB. Thus, the amount of time for inspecting the battery 1 for a short circuit can be further decreased, and the amount of time for manufacturing the battery 1 can be further decreased.

Second Modification Example

A second modification example of the first embodiment will be described (refer to FIG. 3). In the method of inspecting the battery 1 for a short circuit and the method of manufacturing the battery 1 according to the first embodiment, device temperature checking step S7 is performed before voltage measurement step S5 and in parallel with voltage measurement step S5 and current detection step S6 in the middle of voltage measurement step S5 and current detection step S6 using the temperature detection device STS and the temperature sensor ST that is brought into contact with the battery 1 to detect the battery temperature TB. Whether or not to continue voltage measurement step S5 and current detection step S6 is determined based on a change in the acquired battery temperature TB(n).

Regarding such a point, in the second modification example, "ambient temperature checking step S8" is performed instead of device temperature checking step S7 to determine whether or not to continue voltage measurement step S5 and current detection step S6 based on a change in the acquired ambient temperature TK(n). Specifically, before voltage measurement step S5, the (n=1)-th ambient temperature TK(1) is measured in ambient temperature checking step S8 using a temperature detection device KTS and a temperature sensor KT configured with a thermistor that detects the ambient temperature TK around the battery 1 as illustrated by broken line in FIG. 5. Then, the (n=2)-th or subsequent ambient temperature TK(n) is measured per second in parallel with voltage measurement step S5 and current detection step S6.

In ambient temperature checking step S8, whether or not a change in the ambient temperature TK(n) with respect to the ambient temperature TK(1) is within an allowed temperature change range DTK is checked. Specifically, in the second modification example, whether or not the ambient temperature TK(n) measured for the second or subsequent time falls within a range of ±0.5° C. with respect to the ambient temperature TK(1) measured for the first time is checked. When the change in the ambient temperature TK(n) is within the allowed temperature change range DTK, voltage measurement step S5 or current detection step S6 is continued. When the change in the ambient temperature TK(n) falls outside the allowed temperature change range DTK, the execution of voltage measurement step S5 or current detection step S6 is stopped, and the inspection for a short circuit is ended.

As described above, when the change in the battery temperature TB is excessive in voltage measurement step S5 and current detection step S6, there is a possibility that an internal short circuit may not be appropriately determined in determination step S9. The ambient temperature TK does not directly affect the determination of an internal short circuit unlike the battery temperature TB. However, when the ambient temperature TK is changed, the battery temperature TB is also changed afterwards. Thus, the change in the ambient temperature TK may affect the determination of an internal short circuit in determination step S9. Regarding such a point, the method of inspection for a short circuit in the second modification example includes ambient temperature checking step S8, and voltage measurement step S5 and current detection step S6 are continued when the change in the ambient temperature TK(n) is within the allowed temperature change range DTK. Thus, an internal short circuit can be appropriately determined in subsequent determination step S9.

Second Embodiment

Figure 11:
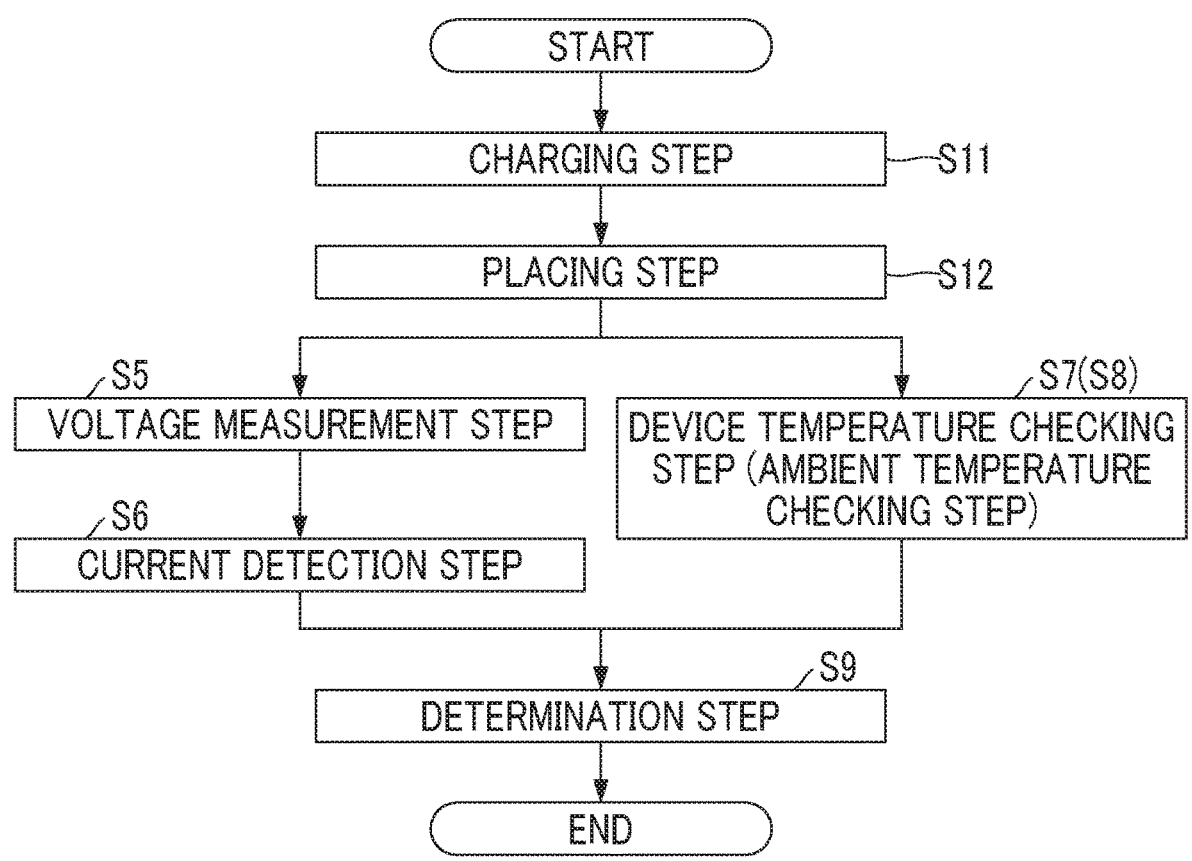
FIG. 11 is a flowchart of a method of inspecting a battery for a short circuit according to a second embodiment.

A second embodiment will be described (refer to FIG. 11). While the battery 1 is inspected for a short circuit in the course of manufacturing the battery 1 in the first embodiment, the second embodiment is different from the first embodiment in that the battery 1 that has been used after becoming available on the market after manufacturing is inspected for a short circuit. While high temperature aging step S3 and cooling step S4 are performed in the first embodiment, the second embodiment is different from the first embodiment in that placing step S12 is performed instead of high temperature aging step S3 and cooling step S4. The same parts as the first embodiment will not be described or will be briefly described.

In the second embodiment, the battery 1 that has been used is restrained in the same manner as the first embodiment. Then, in "charging step S11", the battery 1 is charged to a preset charging state. Specifically, in the same manner as first-time charging step S2 in the first embodiment, the charging and discharging device (not illustrated) is connected to the battery 1 to charge the battery 1 to the battery voltage VB=4.1 V corresponding to 100% SOC by constant current constant voltage (CCCV) charging under a condition of ambient temperature TK=25° C.

Then, in "placing step S12", the battery 1 is placed (in the second embodiment, for six hours) under a condition of ambient temperature TK=20° C. equal to the battery inspection temperature TB1 (in the second embodiment, TB1=20° C.), and the battery temperature TB of the battery 1 is set to battery inspection temperature TB1. Maintaining the placing period in placing step S12 can stabilize the battery voltage VB. Thus, voltage measurement step S5 can be performed for the battery 1 of which the battery voltage VB is stabilized. Since the battery temperature TB is set to the battery inspection temperature TB1, voltage measurement step S5 can be performed for the battery 1 set to the battery inspection temperature TB1.

Then, device temperature checking step S7 (or ambient temperature checking step S8), voltage measurement step S5, current detection step S6, and determination step S9 are performed in the same manner as the first embodiment. Accordingly, the inspection of the battery 1 for an internal short circuit is ended.

Even in the method of inspecting the battery 1 for a short circuit in the second embodiment, voltage measurement step S5, current detection step S6, and determination step S9 are performed, and an internal short circuit in the battery 1 is determined based on the stable current value IBs. Accordingly, the battery 1 can be inspected for an internal short circuit using a new method that uses the current IB flowing to the battery 1 from the external electric power supply EP. The same parts as the first embodiment or the first and second modification examples accomplish the same effect as the first embodiment or the first and second modification examples.

While the present disclosure has been described thus far based on the first and second embodiments and the first and second modification examples, the present disclosure is not limited to the first and second embodiment and the first and second modification examples. Appropriate changes may be applied to the present disclosure without departing from the nature of the present disclosure. For example, while a determination as to whether the inspected battery 1 is a normal product or a defective product is performed based on the stable current value IBs or the magnitude of the current increase amount ΔIB in determination step S9 in the first and second embodiments and the first and second modification examples, the method of determination is not limited thereto. For example, in determination step S9, the degree of an internal short circuit in the inspected battery 1 may be divided into ranks based on the stable current value IBs or the magnitude of the current increase amount ΔIB. Specifically, not only the battery 1 is divided into a normal product and a defective product, but also the normal product of the battery can be further divided into a plurality of ranks based on the stable current value IBs or the magnitude of the current increase amount ΔIB.

While merely one of device temperature checking step S7 or ambient temperature checking step S8 is performed in the first and second embodiments and the like, both of device temperature checking step S7 and ambient temperature checking step S8 may be performed. While the battery 1 that includes the flat wound electrode body 20 is illustrated as a battery of an inspection target for an internal short circuit in the first and second embodiments and the like, the present disclosure is not limited thereto. The inspection target for an internal short circuit can be a battery that includes a stacked electrode body. In the case of using the stacked electrode body, the battery is compressed in the stack direction of a positive electrode plate, a separator, and a negative electrode plate when the positive electrode plate, the separator, and the negative electrode plate are compressed.

What is claimed is:

1. A method of inspecting an electric power storage device for a short circuit by inspecting the electric power storage device for an internal short circuit, the method comprising:
   voltage measuring of measuring a pre-detection device voltage of the electric power storage device that is pre-charged;
   current detecting of detecting a temporal change in a current flowing to the electric power storage device from an external electric power supply or a stable current value of the current by continuously applying an output voltage equal to the pre-detection device voltage to the electric power storage device from the external electric power supply; and
   determining of determining the internal short circuit in the electric power storage device based on the detected temporal change in the current or the stable current value of the current.

2. The method according to claim 1, wherein the voltage measuring and the current detecting are performed under a condition that a device temperature of the electric power storage device is equal to a device inspection temperature as a constant temperature.

3. The method according to claim 2, further comprising device temperature checking of measuring the device temperature of the electric power storage device a plurality of number of times at intervals before the voltage measuring and in parallel with the voltage measuring and the current detecting in the middle of the voltage measuring and the current detecting, and continuing the voltage measuring and the current detecting when a change in the acquired device temperature is within an allowed temperature change range.

4. The method according to claim 2, further comprising ambient temperature checking of measuring an ambient temperature of the electric power storage device a plurality of number of times at intervals before the voltage measuring and in parallel with the voltage measuring and the current detecting in the middle of the voltage measuring and the current detecting, and continuing the voltage measuring and the current detecting when a change in the acquired ambient temperature is within an allowed temperature change range.

5. The method according to claim 2, further comprising:
   high temperature aging of placing the pre-charged electric power storage device under a condition of an ambient temperature of 40° C. to 85° C. for a preset placing time period before the voltage measuring; and
   cooling of setting the device temperature of the electric power storage device to the device inspection temperature by forced cooling or placed cooling after the high temperature aging.

6. The method according to claim 2, further comprising placing of setting the device temperature of the electric power storage device to the device inspection temperature by placing the pre-charged electric power storage device under a condition of an ambient temperature equal to the device inspection temperature before the voltage measuring.

7. The method according to claim 1, wherein the voltage measuring and the current detecting are performed in a state where a positive electrode plate, a negative electrode plate, and a separator interposed between the positive electrode plate and the negative electrode plate in the electric power storage device are compressed in a thickness direction of the separator at a preset compression force from an outside of the electric power storage device.

8. A method of manufacturing an electric power storage device, the method comprising:
   first-time charging of charging an assembled non-charged electric power storage device for the first time to a preset charging state to acquire a pre-charged electric power storage device; and
   inspecting of inspecting the electric power storage device for a short circuit using the method according to claim 1.

* * * * *